(12) United States Patent
Suzuki

(10) Patent No.: US 11,925,025 B2
(45) Date of Patent: Mar. 5, 2024

(54) SEMICONDUCTOR DEVICE AND METHOD OF CONTROLLING THE SAME

(71) Applicant: RENESAS ELECTRONICS CORPORATION, Tokyo (JP)

(72) Inventor: Junichi Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 780 days.

(21) Appl. No.: 17/095,018

(22) Filed: Nov. 11, 2020

(65) Prior Publication Data
US 2021/0143168 A1 May 13, 2021

(30) Foreign Application Priority Data

Nov. 12, 2019 (JP) ................. 2019-204402

(51) Int. Cl.
| | |
|---|---|
| H10B 43/30 | (2023.01) |
| H01L 21/8234 | (2006.01) |
| H01L 21/8238 | (2006.01) |
| H10B 10/00 | (2023.01) |
| H10B 12/00 | (2023.01) |
| H10B 20/00 | (2023.01) |
| H10B 41/40 | (2023.01) |
| H10B 43/40 | (2023.01) |

(52) U.S. Cl.
CPC ..... *H10B 43/30* (2023.02); *H01L 21/823462* (2013.01); *H01L 21/823857* (2013.01); *H10B 10/18* (2023.02); *H10B 12/50* (2023.02); *H10B 20/367* (2023.02); *H10B 41/40* (2023.02); *H10B 43/40* (2023.02)

(58) Field of Classification Search
CPC .. H10B 43/40; H10B 41/40–41; H10B 10/18; H10B 12/50; H01L 21/823857; H01L 21/823462
See application file for complete search history.

(56) References Cited

U.S. PATENT DOCUMENTS

2014/0036591 A1    2/2014    Takeshita

FOREIGN PATENT DOCUMENTS

JP    2014-029745 A    2/2014

*Primary Examiner* — Amar Movva
(74) *Attorney, Agent, or Firm* — Rimon P.C.

(57) ABSTRACT

An occupied area of the switch circuit electrically connected to a memory cell is reduced to reduce the size of a semiconductor device. A semiconductor device according to an embodiment includes a memory cell on a semiconductor substrate and a semiconductor chip in which a switch circuit electrically connected to the memory cell is formed, wherein the switch circuit includes a second transistor electrically connected to the memory cell, and the second transistor includes a second word gate formed on the semiconductor substrate through a third gate insulating film, and a second coupling gate formed on the semiconductor substrate through a fourth gate insulating film having a thickness greater than that of the third gate insulating film, wherein a voltage higher than a voltage applied to the second word gate is applied to the second coupling gate of the second transistor when a current is applied to the memory cell.

8 Claims, 11 Drawing Sheets

SEMICONDUCTOR DEVICE AND METHOD OF CONTROLLING THE SAME

CROSS-REFERENCE TO RELATED APPLICATIONS

The disclosure of Japanese Patent Application No. 2019-204402 filed on Nov. 12, 2019 including the specification, drawings and abstract is incorporated herein by reference in its entirety.

BACKGROUND

The present invention relates to a semiconductor device and a method of controlling the semiconductor device, and to a structure of a nonvolatile memory device such as a flash memory device.

For example, a memory device has a common source line for commonly connecting sources of a plurality of memory cells.

In this regard, there is a disclosed technique below.
[Patent Document 1] Japanese Unexamined Patent Application Publication No. 2014-29745

SUMMARY

Generally, a high voltage is applied to a memory cell of a nonvolatile memory device, such as a flash memory device.

Recently, as the miniaturization of semiconductor devices advances, the power supply voltage of transistors used in logic circuits has decreased.

Therefore, the output voltage of the normal transistor used in the control circuit (e.g., 1.5V), even if the gate drive voltage is applied to the gate of the transistor having a high withstand voltage, the source of the transistor having a high withstand voltage, it is impossible to flow enough current between the drain there is a problem.

Therefore, in order to flow a sufficient current to the transistor in a state where the gate voltage can not be set high, it is necessary to increase the gate width, there is a problem that the occupied area of the transistor of the high breakdown voltage is increased.

Further, when the occupied area of the transistor of the high breakdown voltage increases, the occupied area of the source driver circuit 154 also increases, there is a problem that can not be reduced chip size of the nonvolatile memory device.

According to one embodiment, the chip area of a semiconductor device including a nonvolatile memory device can be reduced.

DETAILED DESCRIPTION

Embodiment 1

Figure 1:
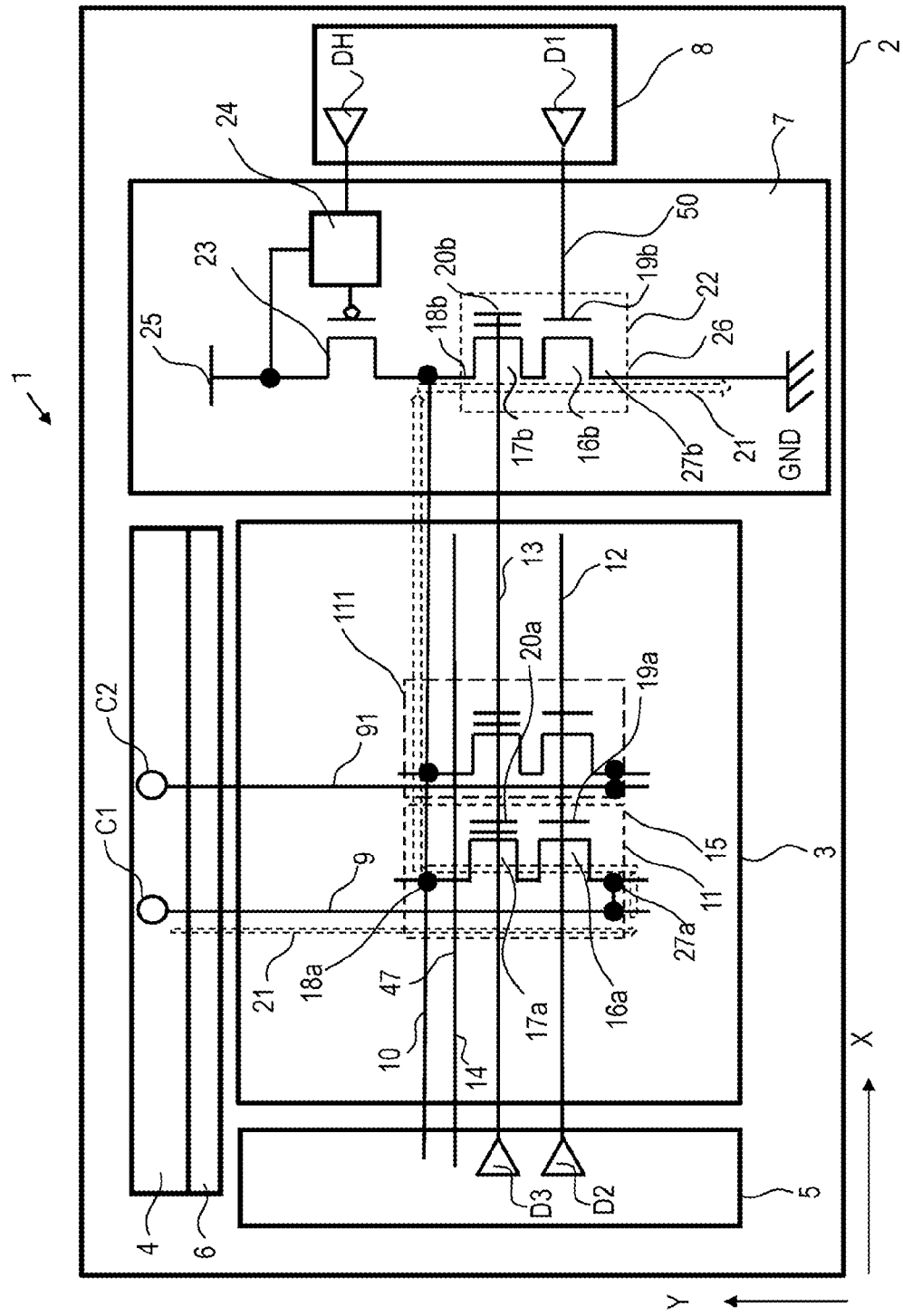
FIG. 1 is a circuit diagram showing a configuration of a semiconductor device including a memory device according to a first embodiment of the present invention.

<Circuit configuration of the semiconductor device according to the first embodiment> FIG. 1 is a circuit diagram showing a configuration example of a semiconductor device 1 including a memory device according to the first embodiment of the present invention. In the description of the first embodiment shown in FIG. 1, the direction indicated by X is described as a horizontal direction (also referred to as a left-right direction or a row direction), and the direction indicated by Y is described as a vertical direction (also referred to as a vertical direction or a column direction). The same applies to the description of other circuit diagrams and plan views of the semiconductor device 1.

The semiconductor device 1 of the first embodiment has a semiconductor substrate 2. The semiconductor substrate 2 includes a memory cell array 3, a column control circuit 4, a row control circuit 5, a source driver circuit 7, and a source driver control circuit 8.

The memory cell array 3 includes a plurality of memory cells 11 and 111, a plurality of bit lines 9 and 91, a plurality of source lines 10, a plurality of word lines 12, a plurality of coupling gate lines 13, and a plurality of erase gate lines 14. For convenience of explanation, the description of the source line 10, the word line 12, the coupling gate line 13, and the plurality of erase gate lines 14 of the other rows is omitted in FIG. 1. A plurality of memory cells 11 are provided in the X direction. A plurality of memory cells 11 are also provided in the Y direction. For convenience of explanation, FIG. 1 omits the description of the memory cell 11 of another row. Therefore, the plurality of memory cells 11 are arranged in the memory cell array 3 in a matrix form in the X direction and the Y direction. One memory cell 11 includes a first transistor 15 formed on the semiconductor substrate 2. The first transistor 15 is composed of a first 1MOS transistor 16a and 2MOS transistor 17a. Bit electrode 27a of the first 1MOS transistor 16a is electrically connected to one bit line 9 of the plurality of bit lines. Source electrode 18a of the first 2MOS transistor 17a is electrically connected to one source line 10 of the plurality of source lines. Electrode on the side different from the bit electrode 27a of the first 1MOS transistor 16a is connected to the electrode on the side different from the source electrode 18a of 2MOS transistor 17a. Therefore the first 1MOS transistor 16a and 2MOS transistor 17a is electrically connected.

1MOS transistor 16a of the memory cell 11 includes a word-gate 19a. The word gate 19a of the memory cell 11 is electrically connected to one word line 12 among a plurality of word lines. The first 2MOS transistor 17a of the memory cell 11 includes a coupling gate 20a. The coupling gate 20a of the memory cell 11 is electrically connected to one of the coupling gate lines 13 of the plurality of coupling gate lines. The first 1MOS transistor 16a is a voltage above the threshold voltage to the word gate 19a (e.g., a voltage of 1.0V or more with reference to the potential of the ground electrode GND. If there is no particular description below the ground electrode potential when added, the semiconductor substrate 2 below the word gate 19a is in a conductive state, the bit electrode 27a channels for current to flow between the opposite electrodes is formed. The first 2MOS transistor 17a is a voltage equal to or higher than the threshold voltage to the coupling gate 20a (e.g., a voltage equal to or higher than 1.5V), the semiconductor substrate below the coupling gate 20a becomes a conductive state, the source electrode 18a channel for current to flow between the opposite electrodes is formed. Therefore, the memory cell 11 can apply a current 21 between the bit electrode 27a and the source electrode 18a by applying a voltage equal to or higher than the threshold voltage to the word gate 19a and the coupling gate 20a. In the first embodiment, as will be described later, the thickness of the gate insulating film of the first 2MOS transistor 17a of the memory cell 11 is thicker than the gate insulating film of the first 1MOS transistor 16a. Therefore, when a current is applied to the memory cell 11, the voltage applied to the coupling gate 20a in order to increase the current flowing through the first 2MOS transistor 17a is higher than the voltage applied to the word gate 19a. The first 2MOS transistor 17a further comprises a floating gate (not shown) between the coupling gate 20a and the semiconductor substrate. In the first embodiment, the current flowing through the first 2MOS transistor 17a of the memory cell 11 is changed by the charges stored in the floating gate. Therefore, by measuring the current 21 flowing between the bit electrode 27a and the source electrode 18a by the sense circuit 6, the data written in the memory cell 11 can be read.

A row control circuit 5 is provided outside the memory cell array 3, for example, on the left side. The row control circuit 5 can be provided adjacent to the memory cell array 3, and may be provided on the right side of the memory cell array 3. The row control circuit 5 includes a plurality of types of driver circuits. In the first embodiment, the row control circuit 5 includes a plurality of second word gate drivers D2 and a plurality of coupling gate drivers D3 (for convenience, the description of the second word gate driver D2 and the coupling gate driver D3 of the other rows is omitted in FIG. 1). A plurality of word lines 12 are electrically connected to corresponding second word gate drivers D2. Therefore, the word gate 19a of the memory cell 11 is supplied with a voltage from the corresponding second word gate driver D2. A plurality of coupling gate lines 13 are electrically connected to corresponding coupling gate drivers D3. Therefore, the coupling gate 20a of the memory cell 11 is supplied with a voltage from the corresponding coupling gate driver D3.

Sense circuit 6 and the column control circuit 4 is electrically connected to the memory cell array 3. Sense circuit 6 and the column control circuit 4 is provided adjacent to the memory cell array 3. The column control circuit 4 includes a plurality of types of driver circuits. In the first embodiment, the column control circuit 4 includes a plurality of current supply circuits C1, C2. A plurality of bit lines 9, 91 are electrically connected to the corresponding current supply circuit C1, C2, respectively. Accordingly, the bit electrode 27a of the memory cell 11 is supplied with a current 21 from one of the corresponding current supply circuits C1 and C2.

A plurality of source driver circuits 7 are electrically connected to the memory cell array 3. The source driver circuit 7 may be provided adjacent to the outside of the memory cell array 3. A plurality of source lines 10 are electrically connected to corresponding source driver circuits 7. One source driver circuit 7 includes at least one first switch 22 and the second switch 23, a level shift circuit 24, a first voltage terminal 25, and a ground electrode GND. The second switch 23 is electrically connected between the source line 10 corresponding to the first voltage terminal 25 and the source driver circuit 7. Thus the second switch 23, the voltage applied to the gate electrode, or electrically connecting the first voltage terminal 25 and the source line 10, can be electrically disconnected. Since the first voltage terminal 25 is a high voltage (e.g., 4.5V) is applied, the level shift circuit 24 is electrically connected to the gate electrode of the second switch 23. Therefore, by applying a control voltage to the gate electrode of the second switch 23 via the level shift circuit 24, the voltage applied to the first voltage terminal 25, can be applied to the source line 10 which is electrically connected to the second switch 23.

The first switch 22 includes a second transistor 26 formed on the semiconductor substrate 2. The second transistor 26 has the same configuration as the first transistor 15 of the memory cell, and includes a first 1MOS transistor 16b and 2MOS transistor 17b. Bit electrode 27b of 1MOS transistor 16b is electrically connected to the ground electrode GND. Source electrode 18b of the first 2MOS transistor 17b is electrically connected to one source line 10 of the plurality of source lines. Electrode on the side different from the bit electrode 27a of the first 1MOS transistor 16b is electrically connected to the electrode on the side different from the source electrode 18b of 2MOS transistor 17b. Therefore, the semiconductor substrate below the word gate 19b is in a conductive state by applying a voltage equal to or higher than the threshold voltage of the first 1MOS transistor 16b (e.g., a voltage of 1.0V) to the word gate 19b of the first switch 22, the coupling gate 20b of the first switch 22 by applying a voltage equal to or higher than the threshold voltage of 2MOS transistor 17b (a voltage of 1.5V) to the coupling gate 20b of the first switch 22 semiconductor substrate below the coupling gate 20b is in a conductive state, a channel for a current flows between the source electrode 18b and the bit electrode 27b of the first switch 22 is formed. By channel is formed in the first switch 22, the current 21 flows from the source line 10 corresponding to the first switch 22 to the ground terminal GND.

In the first embodiment, the coupling gate 20b of the first switch 22, the coupling gate 20a of the memory cell 11 corresponding to the first switch 22, via the coupling gate line 13, is electrically connected. Therefore, in order to flow a current to the memory cell 11, when applying a voltage equal to or higher than the threshold voltage of the first 2MOS transistor 17a to the coupling gate 20a of the memory cell 11, the coupling gate 20b of the first switch 22 also applies a voltage equal to or higher than the threshold voltage of the first 2MOS transistor 17b. Therefore when reading the data of the memory cell 11, by applying a voltage equal to or higher than the threshold voltage of the first 1MOS transistor 16a to the word gate 19b of the first switch 22, the first switch 22 is in a conductive state, the current 21 flowing through the memory cell 11 flows to the ground electrode GND through the source line 10. Further, by applying a voltage lower than the threshold voltage of the first 1MOS transistor 16b to the word gate 19b of the first switch 22, the semiconductor substrate below the word gate 19b becomes a non-conductive state, and the first switch 22 becomes a non-conductive state. Therefore, the current 21 of the memory cell 11 flowing through the source line 10 can be cut off. For convenience of explanation of the operation of the first switch 22, the memory cell 11 is described based on an erased state, i.e., a state in which no charge is injected into the floating gate.

The semiconductor device 1 includes a source driver control circuit 8 for supplying a control voltage to the source driver circuit 7. The source driver control circuit 8 includes a first word gate driver D1 for supplying a control voltage to the word gate 19b of the first switch 22, and a second switch driver DH for supplying a control signal to the second switch 23 via the level shift circuit 24. Therefore, the word gate 19b of the first switch 22 is electrically connected to the output terminal of the first word gate driver D1, and the first switch 22 is controlled to be conductive or non-conductive by the first word gate driver D1. Since the input terminal of the level shift circuit 24 electrically connected to the gate of the second switch 23 is also electrically connected to the output terminal of the second switch driver DH, the second switch 23 is also controlled to a conductive state or non-conductive state by the second switch driver DH.

In the first embodiment, the first switch 22 has the same configuration as that of the memory cell 11. Since the memory cell 11 has a high withstand voltage and a small size, the area occupied by the first switch 22 can be reduced. Therefore, in the first embodiment, it is possible to reduce the occupation area of the first switch 22 of the semiconductor device 1, the occupied area of the source driver circuit 7 having a first switch 22 can also be reduced. Therefore, in the first embodiment, it is possible to reduce the source driver circuit 7 of the semiconductor device 1, it is possible to reduce the size of the semiconductor device 1.

Semiconductor Device of Comparative Example

Figure 2:
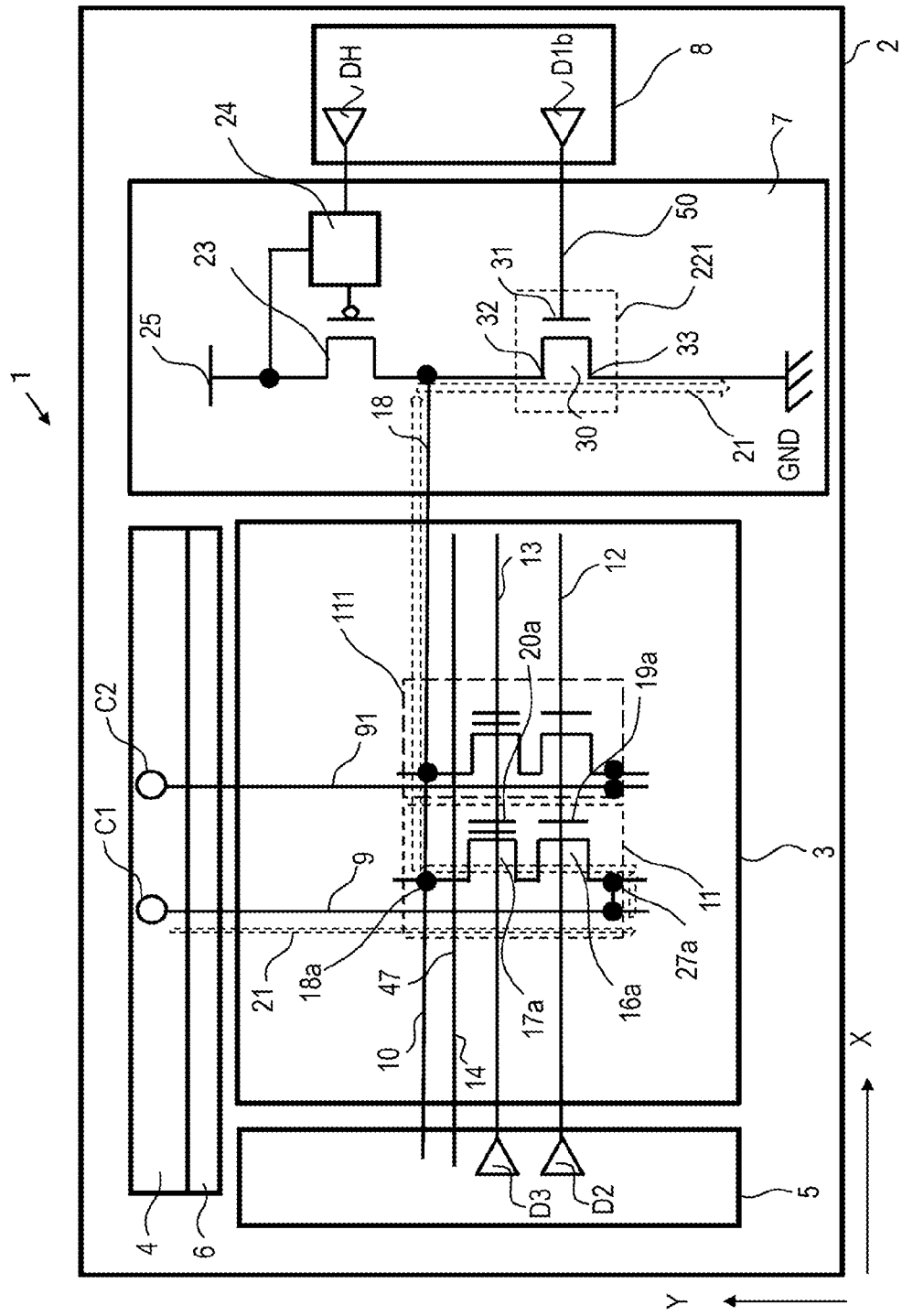
FIG. 2 is a circuit diagram of a semiconductor device of a comparative example.

Next will be described a semiconductor device of the comparative example in the case of using a high breakdown voltage MOS transistor to the first switch. FIG. 2 is a circuit diagram of a semiconductor device 1 of the comparative example. High breakdown voltage MOS transistor 30 is used in the first switch 221 in the comparative example. In the semiconductor device 1 of the comparative example, the gate electrode 31 of the high breakdown voltage MOS transistor 30 is electrically connected to the word gate driver D1b of the first switch. Therefore, by supplying a voltage higher than the threshold voltage of the high withstand voltage MOS transistor 30 from the word gate driver D1b to the gate electrode 31, the semiconductor substrate under the gate electrode 31 becomes conductive. Therefore, the source electrode 32 and the drain electrode 33 of the high breakdown voltage MOS transistor 30 is electrically connected to the conductive source line 10 and the ground electrode GND. When a voltage lower than the threshold voltage of the high breakdown voltage MOS transistor 30 is supplied from the word gate driver D1b to the gate electrode 31, the semiconductor substrate under the gate electrode 31 becomes a non-conductive state. Therefore, since between the source electrode 32 and the drain electrode 33 of the high breakdown voltage MOS transistor 30 is non-conductive, between the source line 10 and the ground electrode GND is insulated. Other descriptions of the circuit diagram of the comparative example of FIG. 2, described above, will be omitted because it is the same as the description of the first embodiment of FIG. 1.

Figure 3:
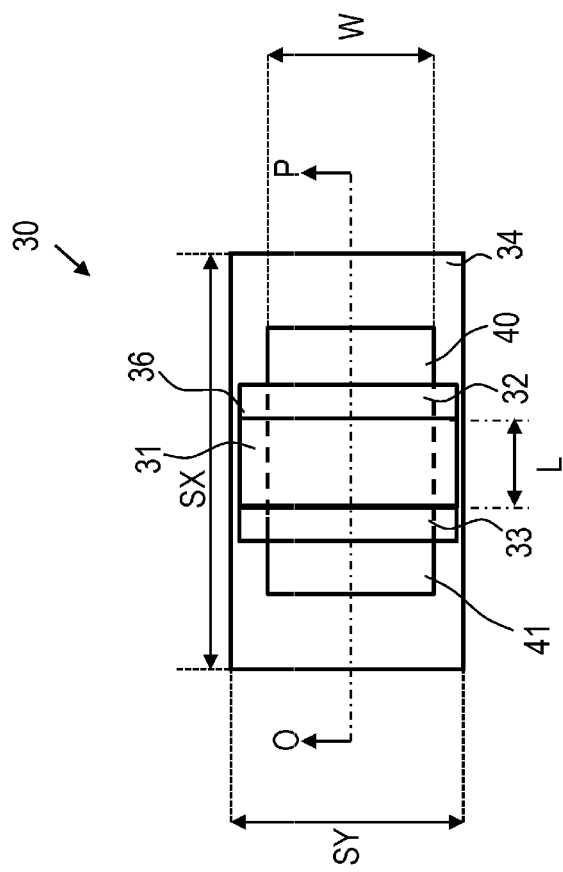
FIG. 3 is a plan view showing a high withstand voltage transistor of the comparative example.
Figure 4:
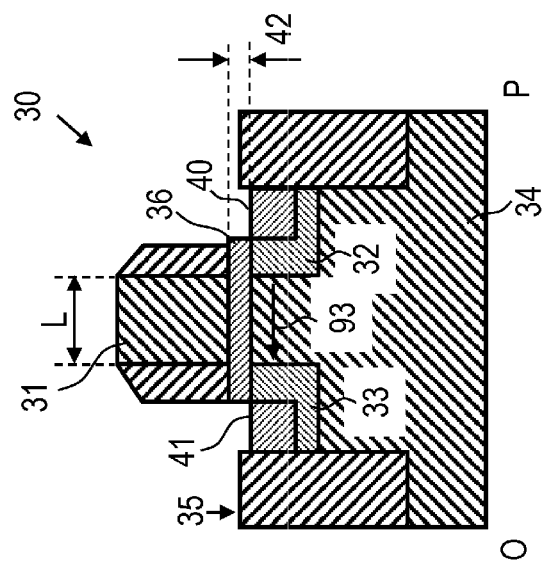
FIG. 4 is a cross-sectional view showing a high withstand voltage transistor of a comparative example, and is a cross-sectional view from 0 to P in FIG. 3.

FIG. 3 is a diagram showing a plane of the high breakdown voltage MOS transistor 30 of the comparative example. FIG. 4 is a diagram showing a cross section of a high breakdown voltage MOS transistor 30 of the comparative example. FIG. 4 shows the O-P cross section of FIG. 3. High breakdown voltage MOS transistor 30 includes a semiconductor substrate 2, a high breakdown voltage gate dielectric film 36 formed on the first main surface 35 of the semiconductor substrate 2, a gate electrode 31 formed on the high breakdown voltage gate dielectric film 36. The semiconductor substrate 2 is made of a semiconductor material of the first conductivity type (e.g., p-type) (e.g., silicon). The gate electrode 31 may be formed of a conductor, for example, polysilicon. High breakdown voltage gate insulating film 36 may be a thick insulator of the film thickness, for example, is formed of silicon oxide. The source electrode 32 is provided in a region close to one end of the gate electrode 31 of the semiconductor substrate 2. Drain electrode 33 is provided in a region close to the other end of the gate electrode 31 of the semiconductor substrate 2. Source electrode 32 and the drain electrode 33 is composed of a diffusion layer of the second conductivity type doped with impurities to the first main surface 35 of the semiconductor substrate (e.g., n-type). The second source electrode 40 is provided in the region of the source electrode 32 is formed by an impurity diffusion layer of the same second conductivity type as the source electrode 32. Also in the region of the drain electrode 33 second drain electrode 41 formed by the same second conductivity type impurity diffusion layer as the drain electrode 33 is provided.

High breakdown voltage MOS transistor 30, in order to increase the dielectric strength between the source electrode 32 and the drain electrode 33, it is necessary to take a length (gate length) L of the gate electrode 31 between the source electrode 32 and the drain electrode 33 sufficiently long. Therefore, the high breakdown voltage MOS transistor 30, as shown in FIG. 3, the length SX in the gate length direction is increased. The high breakdown voltage MOS transistor 30, in order to increase the dielectric strength between the gate electrode and the semiconductor substrate 34, it is necessary to sufficiently thick the thickness 42 of the gate insulating film 36. Therefore, the high breakdown voltage MOS transistor 30, as compared with the transistor gate insulating film is not thin high breakdown voltage, it is impossible to increase the amount of current 93 flowing from the source electrode 32 to the drain electrode 33. In general, the high breakdown voltage MOS transistor 30, in order to increase the amount of current flowing from the first source diffusion layer 32 to the first drain diffusion layer 33, it is necessary to increase the width W of the gate electrode 31. Therefore, the high breakdown voltage MOS transistor 30, the length SY in the width direction of the gate electrode 31 is increased.

Therefore, in the semiconductor device 1 of the comparative example of using the high breakdown voltage MOS transistor 30 to the source driver circuit 7, the width and length of the gate electrode of the source driver circuit 7 is increased, can not reduce the occupied area of the semiconductor substrate 2, the semiconductor device 1 there is a problem that can not be miniaturized.

Figure 5:
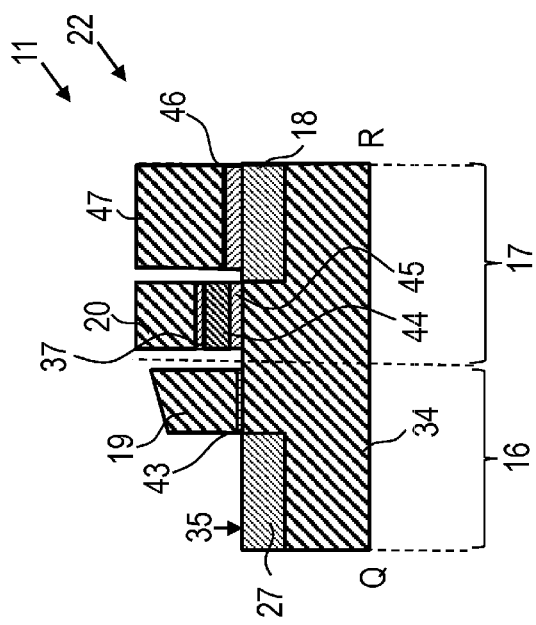
FIG. 5 is a cross-sectional view of a device structure of a first switch and a memory cell of the semiconductor device according to the first embodiment of the present invention, and is a cross-sectional view from Q to R in FIG. 9.

<Consideration of the semiconductor device improved the first switch> The inventor of the present patent application, the first switch 22, while having a high dielectric strength, and was considered to be miniaturized than the high breakdown voltage MOS transistor 30 of the conventional example. As a result, the inventor has conceived the idea of configuring the first switch 22 of the semiconductor device 1, the second transistor 26 having the same structure as the first transistor 15 constituting the memory cell 11. FIG. 5 is a cross-sectional view showing a device structure of the memory cell 11 and the first switch 22 in the semiconductor device 1 of FIG. 1. The semiconductor substrate 34 is made of a semiconductor material of the first conductivity type (e.g., p-type) (e.g., silicon). The memory cell 11 and the first switch 22 of the first embodiment has a first transistor 15 and a second transistor 26 composed of a first 1MOS transistor 16 (reference numeral 16 includes reference numeral 16a and 16b. Other numerals also use reference numerals of the upper concepts except suffix in the description relating to FIG. 5 below) and a first 2MOS transistor 17 (reference numeral 17 includes 17a and 17b). The first 1MOS transistor 16 includes a semiconductor substrate 34, a word gate 19 (19 includes 19a and 19b), and a first gate insulating film 43 and the bit electrode 27 (27 includes 27a and 27b). The first 2MOS transistor 17 includes a semiconductor substrate 34, a floating gate 44, a second gate insulating film 45, a coupling gate 20 (20 includes 20a and 20b) and the source electrode 18 (18 includes 18a and 18b). The sides of the bit electrode 27 and the different side of the first 1MOS transistor 16 is provided close to the sides of the source electrode 18 and the different side of 2MOS transistor 17. Semiconductor substrate of the side different from the source electrode 18 of the side and 2MOS transistor 17 of the bit electrode 27 of the first 1MOS transistor 16, for example, like the bit electrode 27 and the source electrode 18, a high-concentration impurity diffusing layer is not formed. However, when a voltage equal to or higher than the threshold voltage is applied to each of the word gate 19 of the first 1MOS transistor 16 and the coupling gate 20 of the first 2MOS transistor 17, since the word gate 19 and the coupling gate 20 are close to each other, the conductive region formed on the semiconductor substrate 34 below the word gate 19 and the conductive region formed on the semiconductor substrate 34 of the coupling gate 20 are connected. Therefore, a current can flow between the source electrode 18 and the bit electrode 27. Thus the first transistor 15 of the memory cell 11 and the first switch 22, as shown in FIG. 1, a circuit equivalent to a circuit in which the first 1MOS transistor 16a (16b) and 2MOS transistor 17a (17b) is electrically connected. The coupling gate 20 is insulated from the floating gate 44 by an interlayer insulating film 37. The memory cell 11 of the first embodiment stores 1-bit data depending on whether or not the amount of charge stored in the floating gate exceeds a predetermined amount. Current flowing through the first 2MOS transistor 17 is changed by the charges stored in the floating gate. Therefore, in the first embodiment, the data written in the memory cell 11 can be read by measuring the current 21 flowing between the bit electrode 27 and the source electrode 18 in the sense circuit 6. On the source electrode 18 of the first 2MOS transistor 17 erase gate 47 is formed through the interlayer insulating film 46. In the first embodiment, the erase gate 47 is formed insulated from the floating gate 44 and the coupling gate 20. Since the erase gate 47 is formed close to the floating gate 44, the charge stored in the floating gate 44 can be moved to an external circuit through the erase gate 47 by applying a high voltage to the erase gate 47. Therefore, data stored in the memory cell 11 can be erased by applying a voltage to the erase gate 47.

The word gate 19, the coupling gate 20, the floating gate 44, and the erase gate 47 may be formed of a conductor, for example, polysilicon. The first gate insulating film 43, the second gate insulating film 45 and the interlayer insulating film 46 may be an insulator, for example, is formed of silicon oxide. Bit electrode 27 is provided in a region close to one end of the word gate 19 of the semiconductor substrate 34. The source electrode 18 is provided in a region close to one end of the coupling gate 20 of the semiconductor substrate 34. Source electrode 18 and the bit electrode 27 is formed of a diffusion layer of the second conductivity type doped with impurities on the first main surface 35 of the semiconductor substrate 34 (e.g., n-type).

Memory cell 11 and the first switch 22 voltage applied between the source electrode 18 and the bit electrode 27 is configured to be applied dispersively to the first 1MOS transistor 16 and 2MOS transistor 17. Therefore, the memory cell 11 and the first switch 22 has a high dielectric strength between the source electrode 18 and the bit electrode 27. Memory cell 11 and the first switch 22 also has a higher dielectric strength between the coupling gate 20 and the source electrode 18 because the thickness of the second gate insulating film 45 of 2MOS transistor 17 is thicker than the first gate insulating film 43 of 1MOS transistor 16. Therefore, the first switch 221 made of the high breakdown voltage MOS transistor 30 of the comparative example shown in FIG. 2, even if replaced with the first switch of the device structure shown in FIG. 5, the dielectric strength of the first switch 22 is not reduced.

The first 1MOS transistor 16 shown in FIG. 5, since the first gate insulating film 43 is thin, it is possible to flow more current. Therefore, the width of the word gate 19 of the first 1MOS transistor 16 can be made smaller than the high breakdown voltage MOS transistor 30. The memory cell 11 and the first switch 22, the voltage applied between the source electrode 18 and the bit electrode 27 is dispersed by the first 1MOS transistor 16 and 2MOS transistor 17. Therefore it is possible to reduce the dielectric strength of the first 1MOS transistor 16 and 2MOS transistor 17. Therefore, the length of the word gate 19 and the coupling gate 20 can be shorter than the length of the high breakdown voltage MOS transistor 30 gate. Thus the memory cell 11 and the first switch 22 shown in FIG. 5, the occupied area is significantly smaller than the high breakdown voltage MOS transistor 30 of Comparative Example.

<Problem when the first switch is configured to be the same as the memory cell> However, the memory cell 11, unlike the high-voltage MOS transistor 30 of the comparative example, has a word gate 19b and two gate electrodes of the coupling gate 20. Therefore, as in the circuit of the semiconductor device 1 shown in FIG. 6, when considering that the first switch 22 is simply configured to be the same as the memory cell 11, it is necessary to consider the word gate 19b of the first switch 22 and the voltage applied to the coupling gate 20. This is because there is a problem that the first switch 22 does not function properly due to the voltage applied to the word gate 19b and the coupling gate 20 of the first switch 22. Further, a voltage exceeding the rating is applied to the first switch 22 by a voltage applied to the word gate 19b and the coupling gate 20 of the first switch 22, the first switch 22 also has a problem of causing dielectric breakdown or deterioration.

Figure 7:
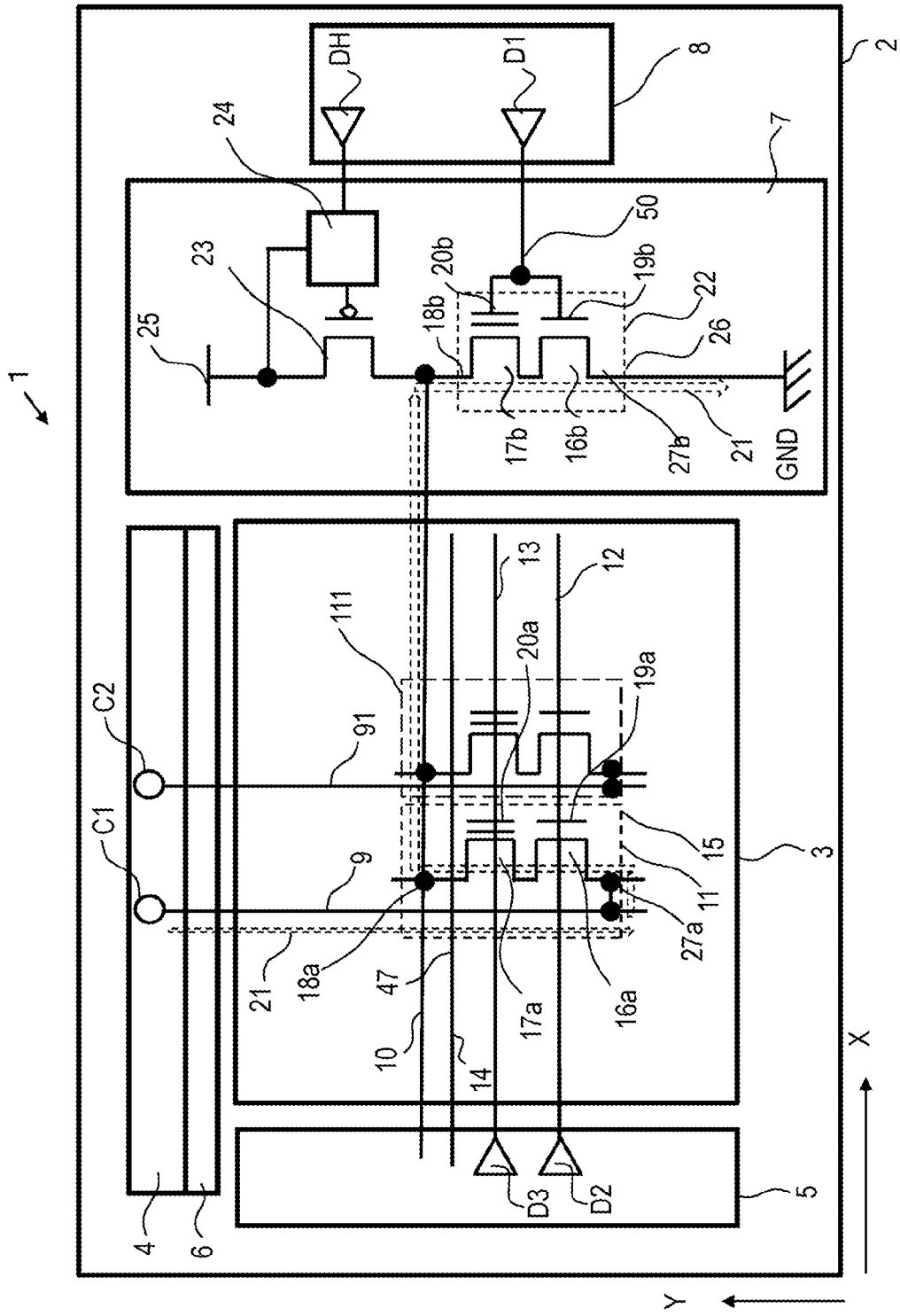
FIG. 7 is a second example of a circuit diagram of a semiconductor device of the previous stage leading to the configuration of the first embodiment.

For example, considering the case where the high-voltage MOS transistor 30 of the semiconductor device 1 shown in FIG. 2 is simply replaced with the first transistor 15 of the memory cell 11, the semiconductor device 1 shown in FIG. In the comparative example shown in FIG. 2, since there is only one word gate driver D1b, the semiconductor device 1 shown in FIG. 7 is configured to apply the gate electrode control voltage 50 from the same word gate driver D1 to the word gate 19b and the coupling gate 20. If a voltage for driving the coupling gate 20 of the memory cell is given to the gate electrode control voltage 50 of the first switch 22, the same voltage is also applied to the word gate 19b of the first switch 22. Since the first gate insulating film 43 below the word gate 19b is formed to have a thinner film thickness than the second gate insulating film 45 below the coupling gate 20, a voltage equal to or higher than the rating of the first gate insulating film 43 is applied to the word gate 19b. Accordingly, the semiconductor device 1 shown in FIG. 7, the first gate insulating film 43 may occur or deterioration of the first gate insulating film 43 becomes faster reliability is lowered problem occurs.

Further, when the gate electrode control voltage 50 of the first switch 22 is suppressed to a low voltage to protect the first gate insulating film 43, the coupling gate 20b of the first switch 22 also the same voltage is applied. Since the thickness of the second gate insulating film 45 under the coupling gate 20 is thicker than the first gate insulating film 43, there is a problem that sufficient conductive region can not be formed in the semiconductor substrate 34 under the coupling gate 20. Accordingly, the semiconductor device 1 shown in FIG. 7, the amount of current flowing through the first switch 22 may also occur a problem of lowering.

Figure 6:
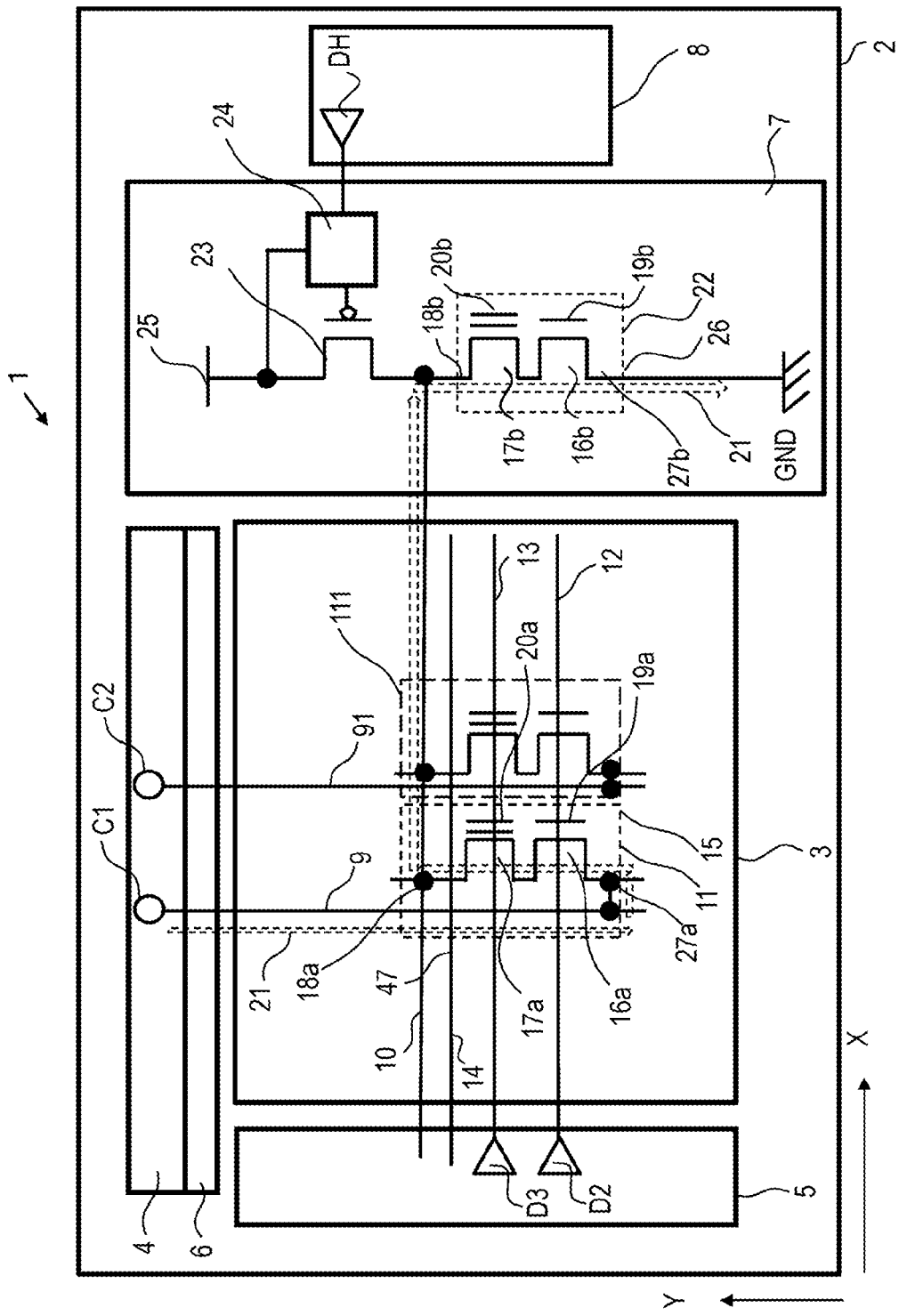
FIG. 6 is a first example of a circuit diagram of a semiconductor device of the previous stage leading to the configuration of the first embodiment.

In the semiconductor device 1 shown in FIG. 6, when writing data to the memory cell 11, the source electrode and the drain electrode of the second switch 23 by applying a control voltage to the gate electrode of the second switch 23 via the level shift circuit 24 from the source driver control circuit 8 to a conductive state. Thus, the voltage applied to the first voltage terminal 25 through the second switch 23 is applied to the source electrode 18a of the first 2MOS transistor 17 of the memory cell 11. When data is written to the memory cell 11, a current for writing data must be supplied to the memory cell to be written. In order to cause a current to flow through the state cell, it is necessary to apply a control voltage to the word gate 19a and the coupling gate 20 of the memory cell 11 in order to make the memory cell conduction. However, when applying a control voltage for setting the first switch 22 to the word gate 19b and the coupling gate of the first switch 22 to a conductive state at this time, through current flows between the ground electrode GND from the first voltage terminal 25 via the first switch 22 and the second switch 23. Therefore, there is a problem that the first switch 22 and the second switch 23 is destroyed by the through current. Accordingly, at least one of the word gate 19b or the coupling gate 20 of the first switch 22 must be able to apply a control voltage that is different from the word gate 19a or the coupling gate 20a of the memory cell 11.

<Circuit configuration of the semiconductor device of the first embodiment> Therefore, the inventor of the present patent application has considered to prevent dielectric breakdown of the first gate insulating film 43 under the word gate 19b by applying a voltage lower than the coupling gate 20b to the word gate 19b of the first switch 22 in the first embodiment shown in FIG. 1. The inventor has also considered to form a sufficient conductive region in the semiconductor substrate 2 below the coupling gate 20b by applying a voltage higher than the word gate 19b to the coupling gate 20b of the first switch 22, to increase the amount of current flowing through the first switch 22.

The inventor has also obtained a configuration in which the word gate 19b of the first switch 22 and the word gate 19b of the memory cell 11 are electrically separated from each other in order to apply a different control voltage to the word gate 19b of the first switch 22 and the word gate 19b of the memory cell 11. Therefore, in the new configuration, when data is written to the memory cell 11, a voltage for turning off the first switch 22 can be applied from the source driver control circuit 8 to the word gate 19b of the first switch 22. Thus, when writing the memory cell 11 in a new configuration, a through current flows between the ground electrode GND from the first voltage terminal 25 via the first switch 22 and second switch 23 first switch 22 and the second switch 23 there is no problem that is destroyed. In the first embodiment, a control voltage is applied to the word gate 19a of the memory cell 11 from the second word gate driver D2 provided in the row control circuit 5 through the word line 12. A control voltage is applied to the word gate 19b of the first switch from a first word gate driver D1 provided in the source driver control circuit 8. In the first embodiment, a control voltage is applied to the word gate 19b of the first switch and the word gate 19a of the memory cell 11 by the first word gate driver D1 and the second word gate driver D2, which are different from each other. Therefore, even if the second switch 23 is in the conductive state in order to place the memory cell 11 in the write state, the first switch 22 can be controlled to the non-conductive state, and the through current can be prevented from flowing to the first switch 22. Since the first word gate driver D1 applies a voltage lower than that of the coupling gate 20b to the word gate 19b, a small circuit having a low withstand voltage can be used. Therefore, the area occupied by the first word gate driver D1 can be reduced.

Further, in the example in which the first switch 22 shown in FIG. 6 is simply the same configuration as the memory cell 11, in order to operate the first switch 22 correctly, it is necessary to consider a method of applying a voltage to the coupling gate 20b. The inventor of the present patent application therefore conceived the idea of electrically connecting the coupling gate 20b of the first switch 22 and the coupling gate 20a of the memory cell 11 as shown in FIG. 1. The first switch 22, when flowing the current 21 flowing through the memory cell 11 to the ground electrode GND, a conductive state. Therefore, when the first switch 22 is in the conductive state, the coupling gate driver D3 applies a control voltage to the coupling gate 20a of the memory cell 11 so that the first 2MOS transistor 17a is in the conductive state. Therefore, by electrically connecting the coupling gate 20b of the first switch 22 and the coupling gate 20a of the memory cell 11, the control voltage is applied to the coupling gate 20b of the first switch 22 by the coupling gate driver D3. Therefore, when a current flows through the memory cell 11, the state gate 20b of the first switch 22 is controlled to be conductive by the coupling gate driver D3. Therefore, by the first word gate driver D1, the first 1MOS transistor 16b is controlled to be conductive, thereby enabling a current to flow to the first switch 22. Further, even when a voltage to make the first 2MOS transistor 17b conduction is applied to the coupling gate 20b of the first switch 22, a voltage to make the first 1MOS transistor 16b non-conductive is applied to the word gate 19b, so that the first switch 22 can be controlled to the non-conductive state. Accordingly, the inventors of the present patent application have discovered that the first switch 22 can operate normally even when the coupling gate 20b of the first switch 22 and the coupling gate 20a of the memory cell 11 are electrically connected.

In the first embodiment, a control voltage is applied to both the coupling gate 20a of the memory cell 11 and the coupling gate 20b of the first switch by the coupling gate driver D3 in the row control circuit 5. Therefore, it is not necessary to provide a driver for supplying a voltage to the coupling gate 20b of the first switch 22, the number of driver circuits is reduced, it is possible to further reduce the size of the semiconductor device 1. In particular, since the second gate insulating film 45 of the first 2MOS transistor 17a is thicker than the first gate insulating film 43, it is required to apply a higher control voltage than the word gate 19b to the coupling gate 20b of the first switch 22. Therefore, the area occupied by the coupling gate driver of the source driver circuit 7 is larger than that of the word gate driver. The effect that the driver for supplying a voltage to the coupling gate 20b of the first switch 22 can be omitted greatly contributes to miniaturization of the source driver circuit 7.

Figure 8:
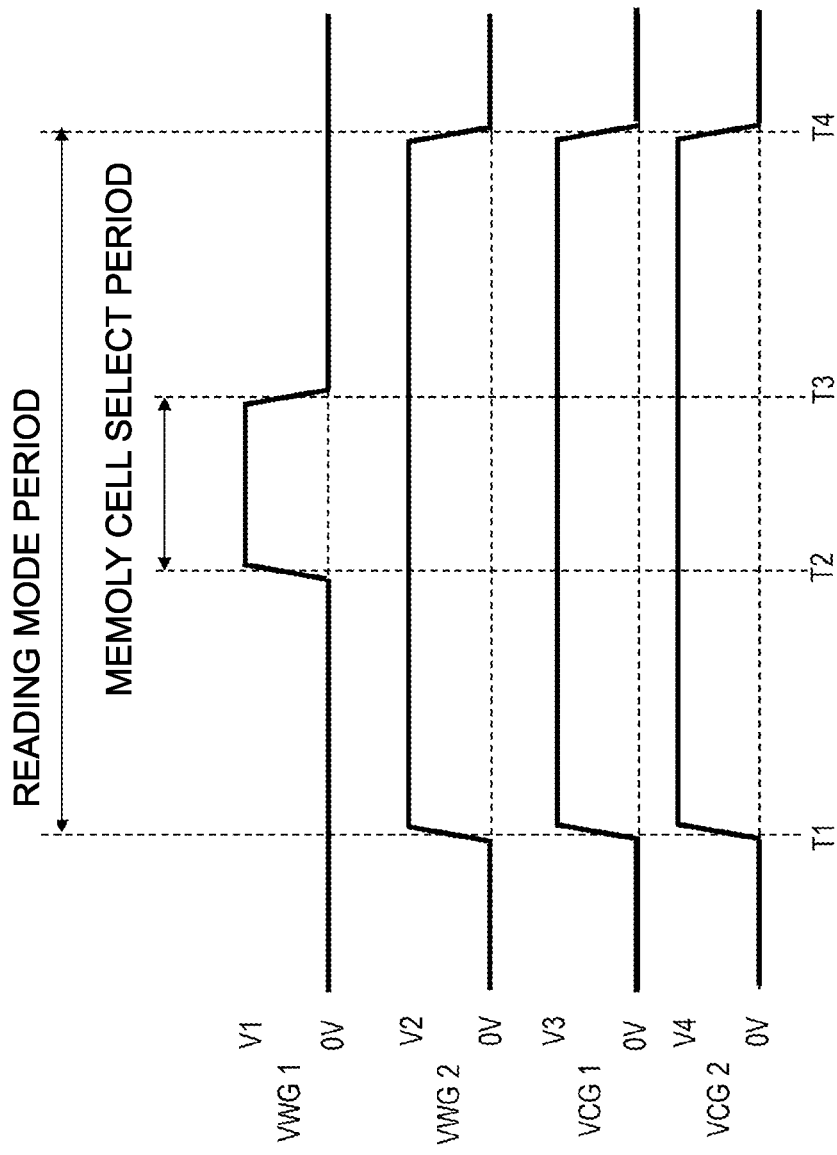
FIG. 8 is a timing chart of a voltage applied to each gate electrode and each gate electrode of the first switch of the memory cell of the first embodiment of the present invention.

<Timing chart of the voltage applied to each gate of the semiconductor device according to the first embodiment>
Next embodiment 1, the temporal relationship of the voltage applied to each gate electrode of each gate electrode and the first switch 22 of the memory cell 11 will be described. FIG. 8 is a timing chart of the voltage applied to each gate electrode of the memory cell 11 and the first switch 22 of the semiconductor device 1. Note that FIG. 8 is a timing chart during the data read mode of the memory cell 11. The horizontal axis of FIG. 8 shows the course of time. The vertical axis of FIG. 8 shows the level of voltage. In FIG. 8, VWG1 indicates the voltage of the word gate 19a of the memory cell 11, VWG2 indicates the voltage of the word gate 19b of the first switch 22, VCG1 indicates the voltage of the coupling gate 20a of the memory cell 11, and VCG2 indicates the voltage of the coupling gate 20b of the first switch 22.

In the first embodiment, when the semiconductor device 1 enters the mode in which the data of the memory cell 11 is read (T1 in FIG. 8), the voltage VWG2 of the word gate 19b of the first switch 22 changes from a voltage 0V lower than the threshold voltage of the word gate 19b to a voltage V2 higher than the threshold voltage. At the same time T1, the voltage VCG1 of the coupling gate 20a of the memory cell 11 changes from a voltage 0V lower than the threshold voltage of the coupling gate 20a to a voltage V3 higher than the threshold voltage. Similarly at the time of T1, the voltage VCG2 of the coupling gate 20b of the first switch 22 changes from a voltage 0V lower than the threshold voltage of the coupling gate 20b to a voltage V4 higher than the threshold voltage. Therefore, the first switch 22 changes from the non-conductive state to the conductive state from the time point T1 when the mode of reading data from the memory cell 11 is entered, and the source line 10 and the ground electrode GND are electrically connected to each other. Further, a conductive region is also formed on the semiconductor substrate below the coupling gate 20a of the memory cell 11. However, at the time of T1, a voltage 0V lower than the threshold voltage of the word gate 19b is applied to the word gate 19b of the memory cell 11, so that the memory cell 11 does not become conductive and current does not flow to the memory cell 11.

Next, when a specified memory cell 11 shown in T2 of FIG. 8 is selected, the voltage VWG1 of the word gate 19a of the memory cell 11 changes from the voltage 0V to a voltage V1 higher than the threshold voltage of the word gate 19b of the memory cell 11. Therefore, since the conduction region is formed on the semiconductor substrate below the word gate 19a of the memory cell 11 from the time of T2 entering the period in which the memory cell 11 is selected, the first transistor 15 is in the conductive state, and the memory cell 11 is in the conductive state. Thus, as shown in FIG. 1, the current 21 generated by the current supply circuit C1 in the column control circuit 4, the sense circuit 6, the bit line 9, the selected memory cell 11, through the source line 10 and the first switch 22, flows to the ground electrode GND. Therefore, in the first embodiment, when the period for selecting the memory cell 11 after T2 shown in FIG. 8 is entered, data written in the selected memory cell 11 can be read by measuring the value of the current 21 flowing through the memory cell 11 by the sense circuit 6.

Next, when the period for selecting the particular memory cell 11 shown in T3 of FIG. 8 ends, the voltage VWG1 of the word gate 19a of the memory cell 11 changes from the voltage V1 to the voltage 0V. Therefore, since the voltage 0V is applied to the word gate 19b of the memory cell 11 after T3 when the selection period of the memory cell 11 is completed, the memory cell 11 becomes non-conductive. Because no current flows through the memory cell 11, no data is read out from the memory cell 11.

Next, when a predetermined period has elapsed after the period for selecting the memory cell 11 shown in T4 of FIG. 8, the mode for reading the data of the memory cell 11 ends. At the time shown in T4 of FIG. 8, the voltage VWG2 of the word gate 19b of the first switch 22 changes from the voltage V2 to the voltage 0V. Further, the voltage VCG2 of the coupling gate 20b of the first switch 22 changes from the voltage V4 to the voltage 0V. Therefore, after the time shown in T4 in FIG. 8, after the mode of reading the data of the memory cell 11 is completed, the first switch 22 is the source line 10 and the ground electrode GND becomes non-conductive state is electrically insulated. At the time shown in T4 of FIG. 8, the voltage VCG1 of the coupling gate 20a of the memory cell 11 changes from the voltage V3 to the voltage 0V, and the first 2MOS transistor 17a becomes non-conductive.

In the first embodiment, since the data of the selected memory cell 11 needs to be read at a high speed, the voltage VWG1 of the word gate 19a of the memory cell 11 needs to be changed at a high speed. In addition, the voltage VWG1 of the word gate 19b of the memory cell 11 needs to be as short as possible during the transition from the voltage 0V lower than the threshold voltage to the voltage V1 higher. Therefore, the word gate driver circuit for driving the word gate 19a of the memory cell 11 is required to operate at a high speed. In the first embodiment, the voltage V3 can be applied to the coupling gate 20a of the memory cell 11 before the time T2 at which the voltage V1 is applied to the word gate 19a of the memory cell 11. In addition, before the time T2, the voltage V2 may be applied to the word gate 19b of the first switch 22 and the voltage V4 may be applied to the coupling gate 20b. Therefore, there is a margin in the time for increasing the coupling gate 20a of the memory cell 11, the word gate 19b of the first switch 22, and the coupling gate 20b voltage value, thereby facilitating voltage control of each gate. In the embodiment, the voltage VWG1 of the word gate 19a of the memory cell 11 drops to a voltage 0V at a time T4 after a period has elapsed from a time T3 at which the voltage VCG1 of the coupling gate 20a of the memory cell 11 drops to a voltage 0V. Similarly, at the time of T4, the voltage VWG2 of the word gate 19b of the first switch 22 and the voltage VCG2 of the coupling gate 20b are reduced to the voltage 0V, respectively. Therefore, there is a margin in the time to lower the voltage value of each gate, the voltage control of each gate is further simplified. Therefore, in the first embodiment, the driving capability of the coupling gate driver D3 for driving the coupling gate 20a of the memory cell 11 and the coupling gate 20b of the first switch 22 can be lowered. Therefore, a small circuit can be used for the coupling gate driver D3. In the first embodiment, the driving capability of the first word gate driver D1 for driving the word gate 19b of the first switch 22 can also be lowered. Therefore, the first word gate driver D1 can also use a small circuit. Therefore, in the first embodiment, in the timing chart shown in FIG. 8, by applying a control voltage to each gate electrode of the memory cell 11 and the first switch 22, it is possible to further miniaturize the semiconductor device 1.

Figure 9:
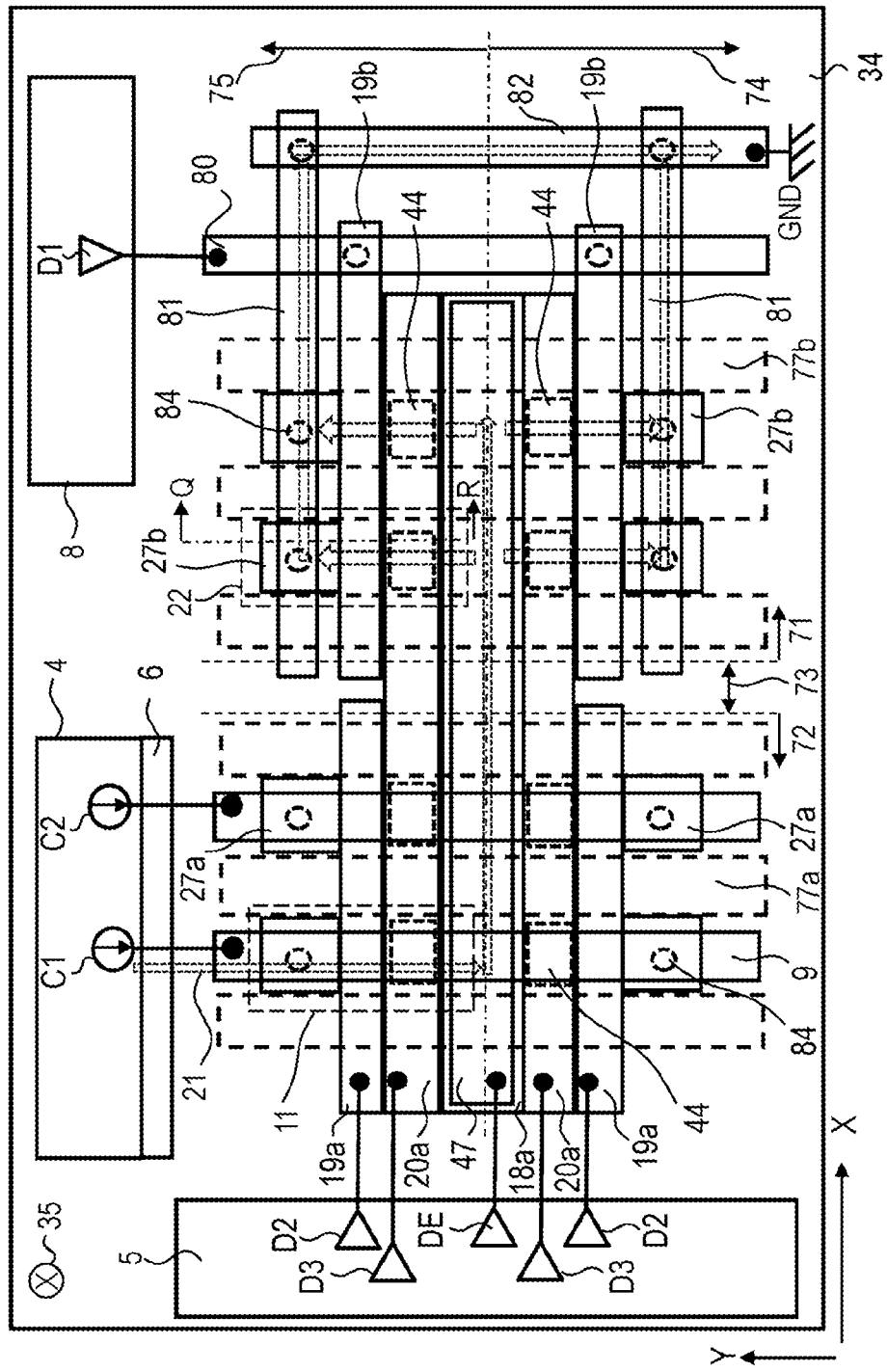
FIG. 9 is a plan view showing the structure of the first switch and the memory cell according to the first embodiment of the present invention.

FIG. 9 is a plan view showing a structure of the first switch 22 and the memory cell 11 according to the first embodiment of the present invention. FIG. 5 is a cross-sectional view from Q to R of the first switch 22 and the memory cell 11 shown in FIG. 9. In the description of the present embodiment shown in FIG. 9, the surface viewed from the top of the paper, it is drawn as a first main surface 35 of the semiconductor substrate 34. The same applies to the plan view described below. In the first embodiment, the semiconductor device 1 is formed on the first main surface of the semiconductor substrate 34. FIG. 9 is an enlarged plan view of a portion of the semiconductor device where the memory cell region 72 and the source driver region 71 are adjacent to each other. In the first embodiment, the word gate 19a, the coupling gate 20a, the source electrode 18a and the erase gate 47 extend in the X direction, respectively. In the first embodiment, the word gate 19b, the coupling gate 20a, the source electrode 18a and the erase gate 47 are arranged side by side in the Y direction. Adjacent to one long side of the word gate 19a, a plurality of bit electrodes 27a are arranged in the extending direction of the word gate 19b (X direction). An element isolation region 77a is provided between two adjacent bit electrodes 27a. In the first embodiment, one memory cell 11 is configured by the bit electrode 27a, the word gate 19a, the coupling gate 20a, and the source electrode 18a. In the first embodiment, the bit electrode 27b, the word gate 19b, constitutes one first switch 22 by the coupling gate 20b and the source electrode 18b. An element isolation region 77b is also provided between two adjacent bit electrodes 27b. In the first embodiment, the word gates 19b and 19a, the coupling gates 20a and 20b, and the erase gate 47 may be formed of a conductive material, for example, polysilicon. The erase gate 47 is electrically connected to the erase gate driver circuit DE and is provided with a voltage. Source electrode 18a, 18b and a plurality of bit electrodes 27a may be a conductor, for example, is formed by a diffusion layer doped with impurities to the semiconductor substrate 34. Further, the element separation region 77a, 77b may be any material capable of insulating the two bit electrodes 27a adjacent, 27b. For example, the element isolation regions 77a and 77b are formed of diffusion layers of the opposite conductivity type to the bit electrodes 27a and 27b. In the first embodiment, a plurality of memory cells 11 are arranged in a matrix in the X direction and the Y direction to form a memory cell array region 72. A plurality of first switches 22 are electrically connected between the memory cell 11 and the ground electrode GND. Therefore, in the first embodiment, a large amount of current can flow between the memory cell 11 and the ground electrode GND. A plurality of first switches 22 are provided in the source driver region 71 outside the memory cell array region 72.

In the first embodiment, since the first switch 22 has the same planar configuration as the memory cell 11, the planar size of the first switch 22 can be reduced to the same size as the memory cell 11. Therefore, in the first embodiment, the source driver region 71 can be greatly reduced than the comparative example using the high breakdown voltage MOS transistor 30. Therefore, in the first embodiment, the size of the semiconductor device 1 can be greatly reduced.

In the first embodiment, the word gate 19a of the memory cell 11 and the word gate 19b of the first switch 22 are formed separately. The word gate 19b of the first switch 22 is electrically connected to a first word gate driver D1 provided in the source driver control circuit 8 via a common word gate line 80. On the other hand, the word gate 19a of the memory cell 11 is electrically connected to the second word gate driver D2 provided in the row control circuit 5.

In the first embodiment, the coupling gate 20a of the memory cell 11 and the coupling gate 20b of the first switch 22 are formed successively. Coupling gates 20a, 20b of the memory cell 11 and the first switch 22 are electrically connected to a coupling gate driver D3 provided in the row control circuit 5. Accordingly, the coupling gates 20a and 20b of the memory cell 11 and the first switch 22 are energized from the row control circuit 5. Therefore, the area of the source driver control circuit 8 becomes unnecessary control circuit for driving the coupling gate 20b of the first switch 22 can be reduced.

The memory cell 11 and the source electrode 18a of the first switch 22 are formed successively. Therefore, the memory cell 11 and the source electrode 18a of the first switch 22 are electrically connected to each other. The bit electrode 27a of the memory cell 11 is connected to the bit line 9. Bit line 9 is electrically connected to the column control circuit 4. Bit electrode 27b of the first switch 22 is connected to the local ground wiring 81. Local ground wiring 81 is electrically connected to the common ground wiring 82. Common ground wiring 82 is electrically connected to the ground electrode. Therefore, by controlling the first switch 22 to a conductive state by the row control circuit 5 and the source driver control circuit 8, from the source electrode 18b, the first switch 22, through the local ground wiring 81 and the common ground wiring 82, it is possible to flow the cell current 21 to the ground electrode GND. In the first embodiment, the plurality of memory cells 11 in one row 74 and the plurality of memory cells 11 in adjacent rows 75 are arranged in line symmetry with the source electrode 18a as the center. Also around the source electrode 18a, a plurality of first switches 22 of a plurality of first switches 22 of one row 74 and a row 75 adjacent thereto are arranged in line symmetry. Therefore, a wiring connecting one source electrode 18a can be connected in common to a plurality of memory cells 11 in a row 75 adjacent to one row 74 and a plurality of first switches 22, and the number of wirings connecting the source electrode 18a is reduced. Furthermore, a plurality of first switches 22 of one row 74 a current 21 flowing from the source electrode 18a to the ground electrode GND, since the flow through a plurality of first switches 22 of the row 75 adjacent thereto, the current 21 path increases.

The effect of the first embodiment The main effects of the first embodiment will be described as follows. According to the first embodiment 1, the first switch 22, using a second transistor having the same configuration as the first transistor of the memory cell. Therefore, it is possible to reduce the occupied area of the first switch 22, it is possible to reduce the size of the entire semiconductor device.

According to the first embodiment, even the first switch 22 occupied area is smaller than the high breakdown voltage transistor has a dielectric strength equivalent to the high breakdown voltage transistor. Therefore, it is possible to reduce the occupied area of the source driver circuit 7 without reducing the reliability, it is possible to reduce the size of the semiconductor device.

Further, since the drive circuit of the coupling gate 20a and the coupling gate 20b of the memory cell of the first switch 22 can be common, it is not require to provide a drive circuit dedicated to the coupling gate 20b of the first switch 22 semiconductor device 1 can be miniaturized.

Further, the voltage VWG2 of the word gate 19b becomes a voltage V3 higher than the threshold voltage before the voltage VWG1 of the word gate 19a becomes a voltage V1 higher than the threshold voltage. Furthermore, the voltage VWG2 of the word gate 19b becomes a voltage 0V lower than the threshold voltage after the voltage VWG1 of the first word gate becomes a voltage 0V lower than the threshold voltage. Therefore, the word gate voltage VWG2 has a margin in the time to switch the voltage, thereby facilitating control of the voltage of the word gate 19b. Therefore, a small circuit having a low driving force can be used for the first word gate driver D1, and there is an effect that the semiconductor device 1 can be further miniaturized.

Embodiment 2

Figure 10:
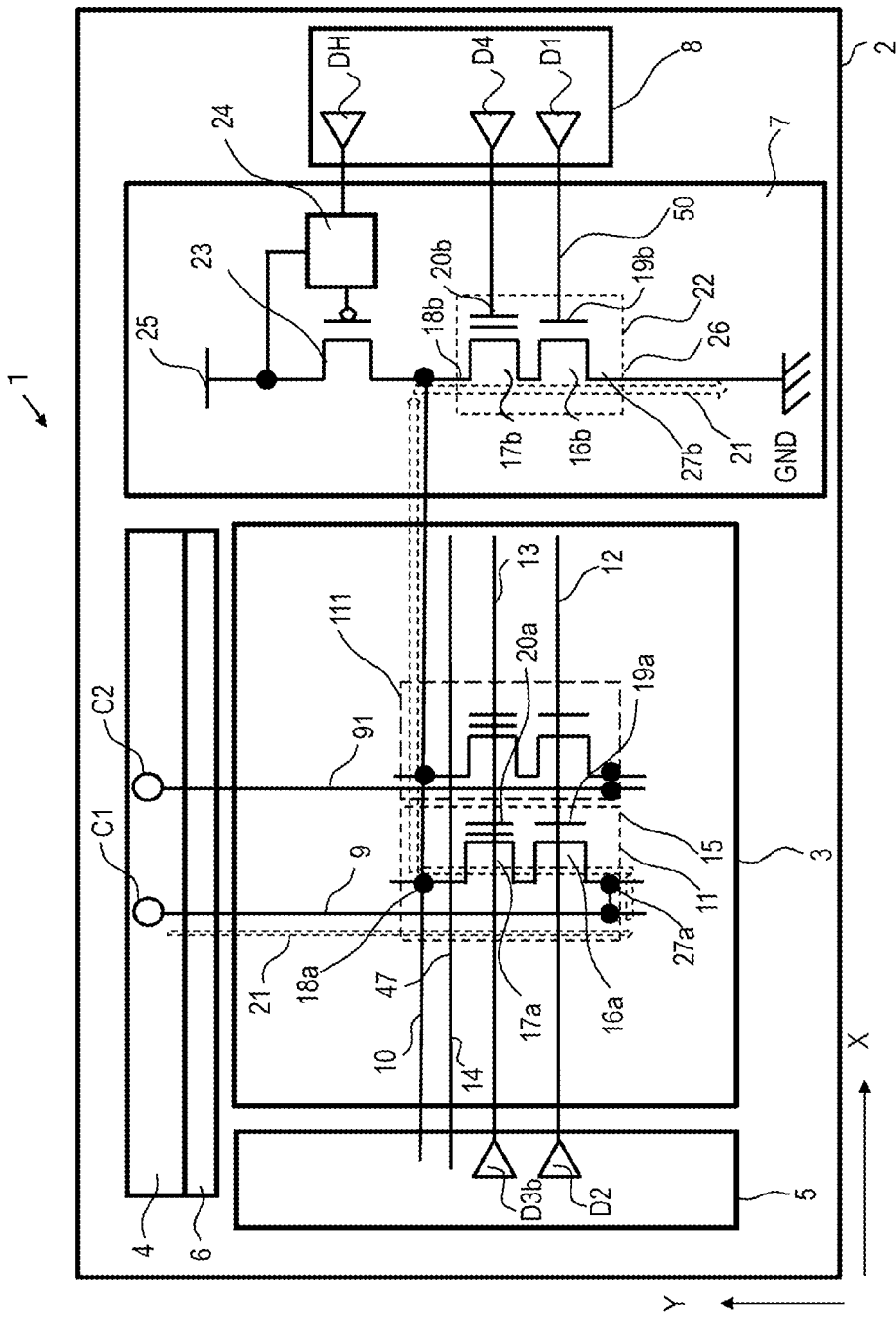
FIG. 10 is a circuit diagram showing a configuration of a semiconductor device including a memory device according to a second embodiment of the present invention.

<Circuit configuration of the semiconductor device according to the second embodiment> Next will be described with reference to FIG. 10 the circuit configuration of the semiconductor device 1 according to the second embodiment. The semiconductor device 1 of the second embodiment differs greatly from the first embodiment in that the coupling gate 20a of the memory cell 11 and the coupling gate 20b of the first switch 22 are electrically separated. In the semiconductor device 1 according to the second embodiment, the coupling gate 20a of the memory cell 11 is electrically connected to the first coupling gate driver D3b provided in the row control circuit 5. In contrast, the coupling gate 20b of the first switch 22 is electrically connected to the second coupling gate driver D4 provided in the source driver control circuit 8. Therefore the semiconductor device 1 according to the second embodiment 1 as compared with the first embodiment, the chip area of the semiconductor device 1 region is required to provide a second coupling gate driver D4 is increased.

However, the coupling gate 20a of the memory cell 11 needs to apply a voltage of a sufficiently high level when data is written to the memory cell 11. On the other hand, the coupling gate 20b of the first switch does not need to write data, and can be driven at a lower voltage than the coupling gate 20a of the memory cell 11. Therefore, in the semiconductor device 1 according to the second embodiment, it is possible to apply a control voltage of a voltage value lower than the coupling gate 20 of the memory cell 11 to the coupling gate 20b of the first switch 22. Therefore, the electric field applied to the first gate insulating film 43 below the word gate 19b adjacent to the coupling gate 20b of the first switch can be further reduced. Therefore, it is possible to further reduce the risk of the first gate insulating film 43 and the first gate insulating film 43 to cause dielectric breakdown is deteriorated. The second coupling gate driver D4 can also use a circuit having an output voltage lower than that of the first coupling gate driver D3b. Therefore, it is possible to suppress the increase in chip area by providing the second coupling gate driver D4 also low.

Figure 11:
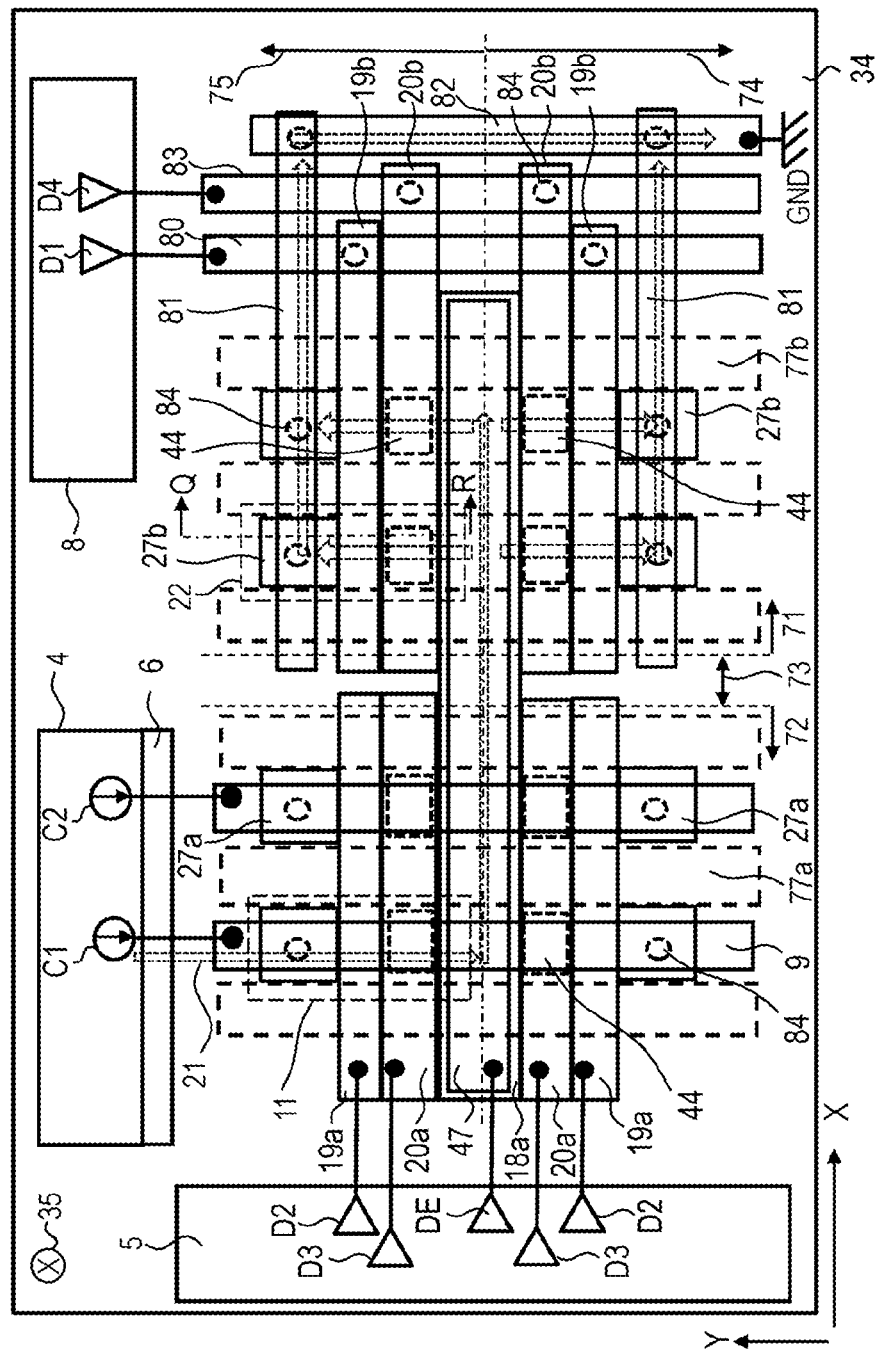
FIG. 11 is a plan view showing the structure of the first switch and the memory cell according to the second embodiment of the present invention.

Planar structure of the semiconductor device according to the second embodiment> FIG. 11 is a plan view showing the structure of the first switch 22 and the memory cell 11 according to the second embodiment of the present invention. In the second embodiment shown in FIG. 11, the coupling gate 20b of the first switch 22 is electrically connected via a connecting member 84 to the common coupling gate wiring 83. Common coupling gate wiring 83 may be any conductive material, for example, can be formed of a metal material such as copper or aluminum. The connecting member 78 may be made of a metal material such as tungsten or titanium.

The common coupling gate line 83 is electrically connected to the second coupling gate driver D4 in the source driver control circuit 8. Therefore, in the second embodiment shown in FIG. 11, a control voltage is applied to the coupling gate 20b of the first switch from the second coupling gate driver D4. Other descriptions of the second embodiment are the same as those of the first embodiment described above, and therefore are omitted.

(Effect of the second embodiment) The main effects of the second embodiment are as follows. According to the semiconductor device 1 of the second embodiment, the coupling gate 20b of the first switch 22, it is possible to apply a control voltage different from the memory cell 11. Therefore, it is possible to supply a voltage lower than the coupling gate 20a of the memory cell 11 to the coupling gate 20b of the first switch 22. Therefore, dielectric breakdown of the first gate insulating film 43 below the word gate 19b adjacent to the 22 coupling gate 20b can be prevented.

Further, according to the second embodiment, it is not require to apply an unnecessary high voltage to the coupling gate 20 of the first switch 22, it is possible to reduce the power consumption of the semiconductor device 1.

What is claimed is:

1. A semiconductor device comprising a memory cell and a switch circuit formed on a semiconductor substrate,
   wherein the switch circuit is disposed outside the memory cell and electrically connected to the memory cell,
   wherein the memory cell includes a plurality of transistors including a first transistor,
   wherein the switch circuit comprises a second transistor electrically connected to the first transistor,
   wherein the second transistor includes:
   a first word gate formed on a first gate insulating film;
   a second word gate formed on a second gate insulating film having a thickness thicker than the first gate insulating film,
   wherein in the second transistor, when a current flows through the switch circuit, a first voltage is supplied from the outside of the switch circuit, so that a first region of the semiconductor substrate under the first word gate becomes conductive state,
   wherein in the second transistor, when a current flows through the switch circuit, a second voltage is supplied from the outside of the switch circuit, so that a second region of the semiconductor substrate under the first coupling gate becomes conductive state, and
   wherein the second voltage is higher than the first voltage.

2. The semiconductor device according to claim 1,
   wherein the first transistor includes:
   a second word gate formed on a third gate insulating film; and
   a second coupling gate formed on a fourth gate insulating film having a thickness thicker than the third gate insulating film, wherein the first transistor includes a first source electrode electrically connected to a second source electrode of the second transistor, wherein in the first transistor, when a current flows through the memory cell, a third voltage is supplied from the outside of the memory cell, so that a third region of the semiconductor substrate under the second word gate becomes conductive state, wherein in the first transistor, when a current flows through the memory cell, a fourth voltage is supplied from the outside of the memory cell, so that a fourth region of the semiconductor substrate under the second coupling gate becomes conductive state, wherein the fourth voltage is higher than the third voltage, and wherein the second voltage is lower than the fourth voltage.

3. The semiconductor device according to claim 1, wherein the first transistor includes:

a second word gate formed on a third gate insulating film; and a second coupling gate formed on a fourth gate insulating film having a thickness thicker than the third gate insulating film, wherein a first source electrode of the first transistor is electrically coupled to a second source electrode of the second transistor, wherein in the first transistor, when a current flows through the memory cell, a third voltage is supplied from the outside of the memory cell, so that a third region of the semiconductor substrate under the second coupling gate becomes conductive state, wherein in the first transistor, when a current flows through the memory cell, a fourth voltage is supplied from the outside of the memory cell, so that a fourth region of the semiconductor substrate under the second coupling gate becomes conductive state, wherein the fourth voltage is higher than the third voltage, and wherein the second voltage is substantially same to the fourth voltage.

4. The semiconductor device according to claim 3, wherein the second coupling gate is supplied with the fourth voltage after the supply of the third voltage to the second word gate is stopped, and wherein the first coupling gate is supplied with the second voltage after the supply of the third voltage to the second word gate is stopped.

5. A semiconductor device comprising a memory cell and a switch circuit formed on a semiconductor substrate, wherein the switch circuit is disposed outside the memory cell and electrically connected to the memory cell, wherein the memory cell includes a plurality of transistors including a first transistor, wherein the switch circuit comprises a second transistor electrically connected to the first transistor, wherein the first transistor includes:

a first word gate formed on a first gate insulating film; and a second word gate formed on a second gate insulating film having a thickness thicker than the first gate insulating film, wherein the second transistor includes:

a second word gate formed on a third gate insulating film; and a second coupling gate formed on a fourth gate insulating film having a thickness thicker than the third gate insulating film, wherein the first transistor includes a first source electrode electrically connected to a second source electrode of the second transistor, and wherein the semiconductor device further comprises:

a first driver circuit configured to supply a first voltage with the first word gate;

a second driver circuit configured to supply a second voltage with the second word gate;

a third driver circuit configured to supply a third voltage higher than the first voltage with the first coupling gate; and a fourth driver circuit configured to supply a fourth voltage higher than the second voltage with the second coupling gate.

6. The semiconductor device of claim 5, wherein the second driver circuit supplies the second voltage to the second word gate before the first driver circuit supplies the first voltage to the first word gate, and wherein the second driver circuit stops supplying the second voltage to the second word gate after the first driver circuit stops supplying the first voltage to the first word gate.

7. The semiconductor device according to claim 6, wherein the third driver circuit and the fourth driver circuit are configured by a common coupling gate driver circuit, and wherein a third voltage and a fourth voltage having the same voltage are supplied from the coupling gate driver circuit to the first coupling gate and the second coupling gate, respectively.

8. The semiconductor device according to claim 6, wherein the fourth driver circuit supplies the fourth voltage of a voltage value lower than the third voltage to the second coupling gate.

* * * * *